United States Patent [19]
Katsuma

[11] Patent Number: 5,852,369
[45] Date of Patent: Dec. 22, 1998

[54] THERMAL PRINTER AND RESISTANCE DATA MEASURING DEVICE FOR THERMAL HEAD OF THE SAME

[75] Inventor: Nobuo Katsuma, Saitama, Japan

[73] Assignee: Fuji Photo Film Co., Ltd., Kanagawa, Japan

[21] Appl. No.: 749,546

[22] Filed: Nov. 15, 1996

[30] Foreign Application Priority Data

| Nov. 16, 1995 | [JP] | Japan | 7-298727 |
| Nov. 16, 1995 | [JP] | Japan | 7-298728 |
| Nov. 8, 1996 | [JP] | Japan | 8-296017 |

[51] Int. Cl.$^6$ .................................................. G01R 27/02
[52] U.S. Cl. ........................ 324/678; 324/658; 324/711; 347/19; 347/211; 358/504
[58] Field of Search .................................. 324/658, 677, 324/678, 703, 711, 721, 549; 347/190, 191, 200, 209, 211, 19; 320/1; 358/504

[56] References Cited

U.S. PATENT DOCUMENTS

| 5,469,068 | 11/1995 | Katsuma | 324/678 |
| 5,528,276 | 6/1996 | Katsuma | 324/678 |
| 5,608,333 | 3/1997 | Hayashi | 324/711 |
| 5,698,987 | 12/1997 | Hayashi | 324/711 |

Primary Examiner—Diep N. Do

[57] ABSTRACT

A thermal head of a thermal printer has plural heating elements arranged along a line and connected in parallel with one another. A respective one of the heating elements is connected to one of plural heat control switches, which are selectively turned on/off for driving the heating elements individually by applying electrical energy to generate heat. To measure resistance data of at least one of the heating elements, a capacitor is connected in parallel with the plural heating elements. A reference resistor is connected in parallel with the plural heating elements and the capacitor. The capacitor is charged, and then discharged via the reference resistor or the one of the heating elements. A voltage across the capacitor is detected. An amount of discharging time required to decrease the capacitor voltage from a predetermined high voltage to a predetermined low voltage is measured while the capacitor is discharged, in association respectively with the reference resistor and the heating elements. Resistance data for the heating elements is determined in accordance with the discharging time of the heating elements, respectively, with reference to the discharging time of the reference resistor.

16 Claims, 11 Drawing Sheets

F I G. 3
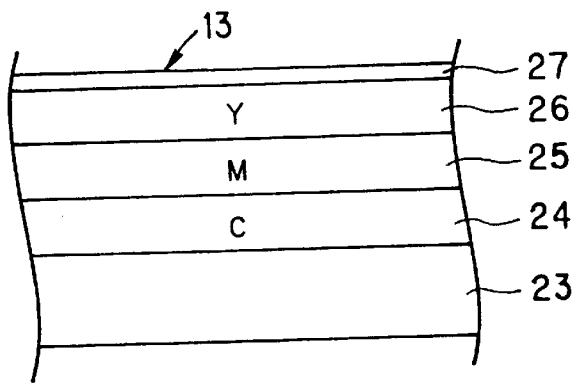
F I G. 4
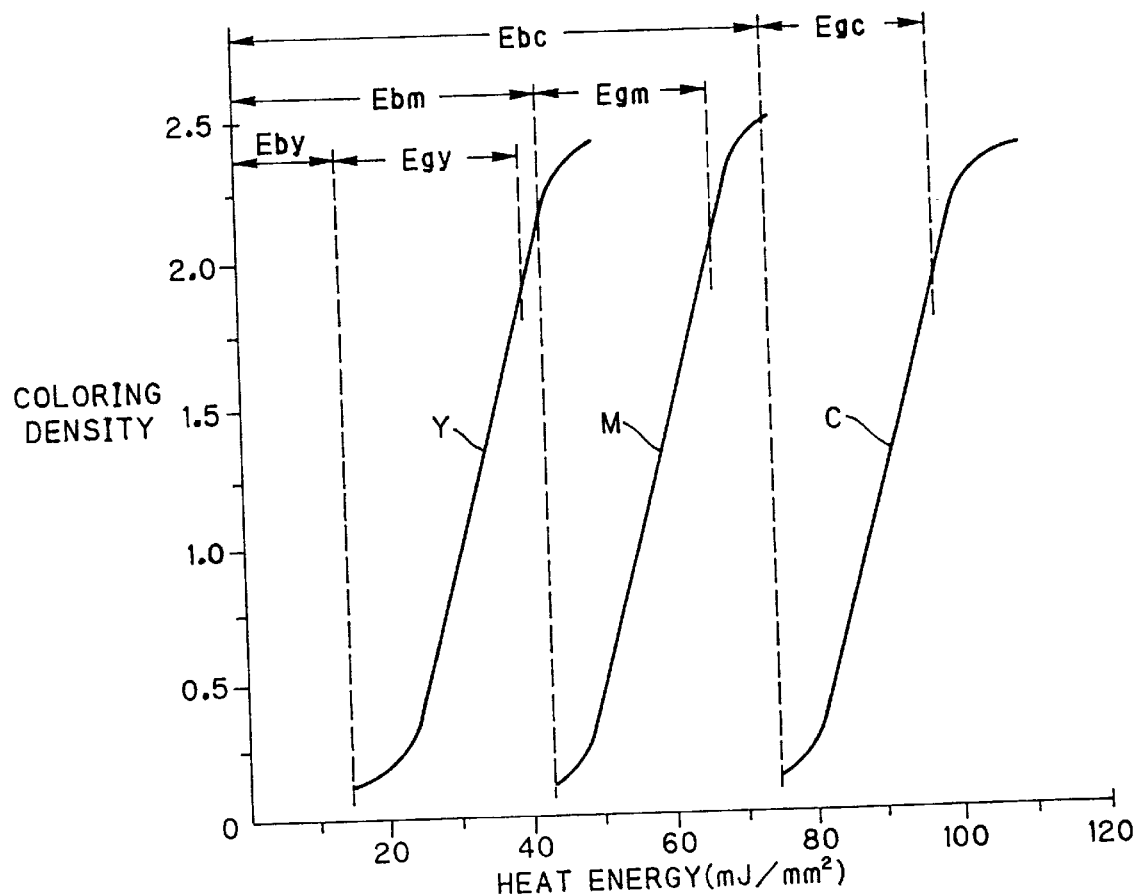

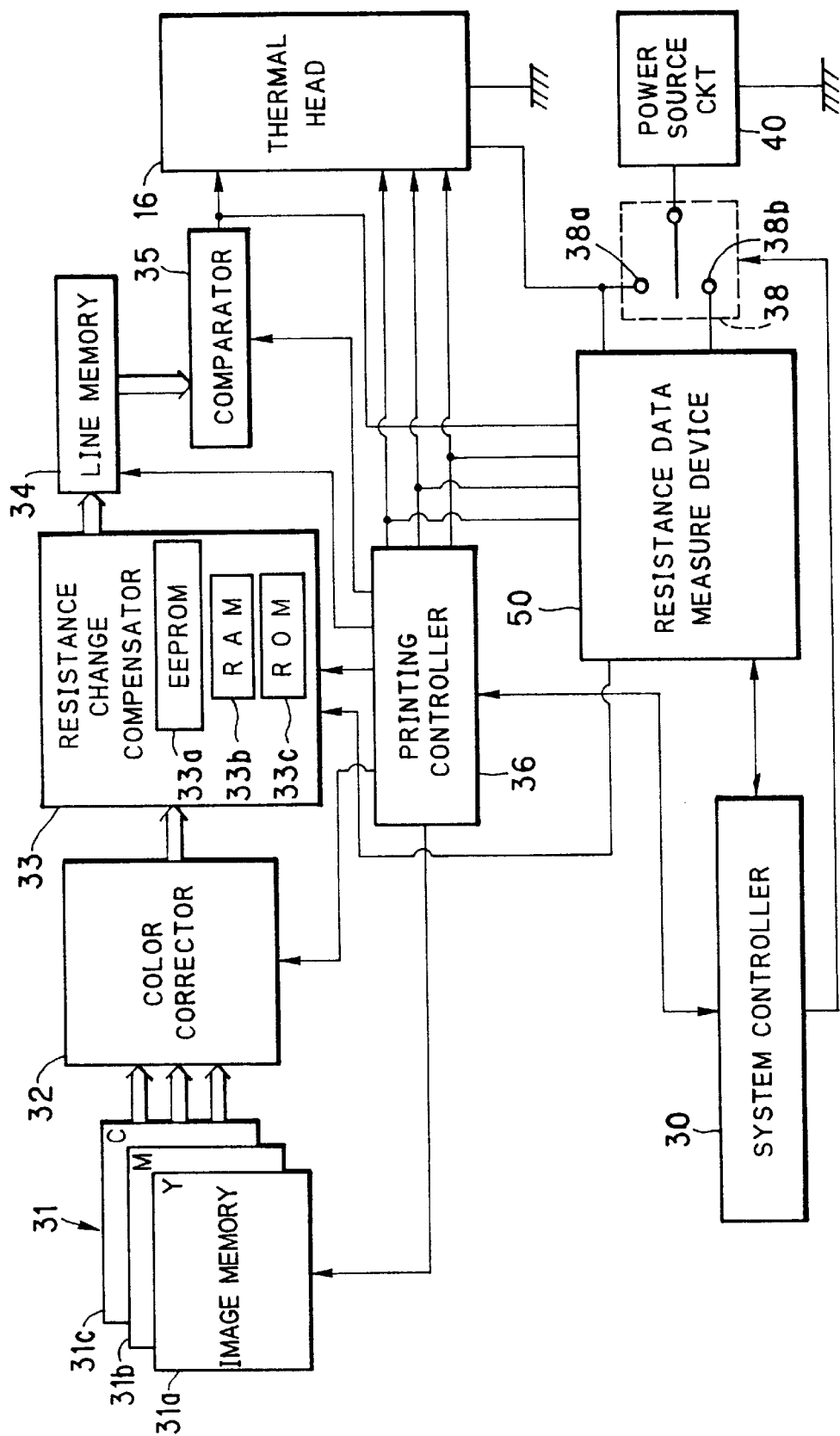
F I G. 5

F I G. 7
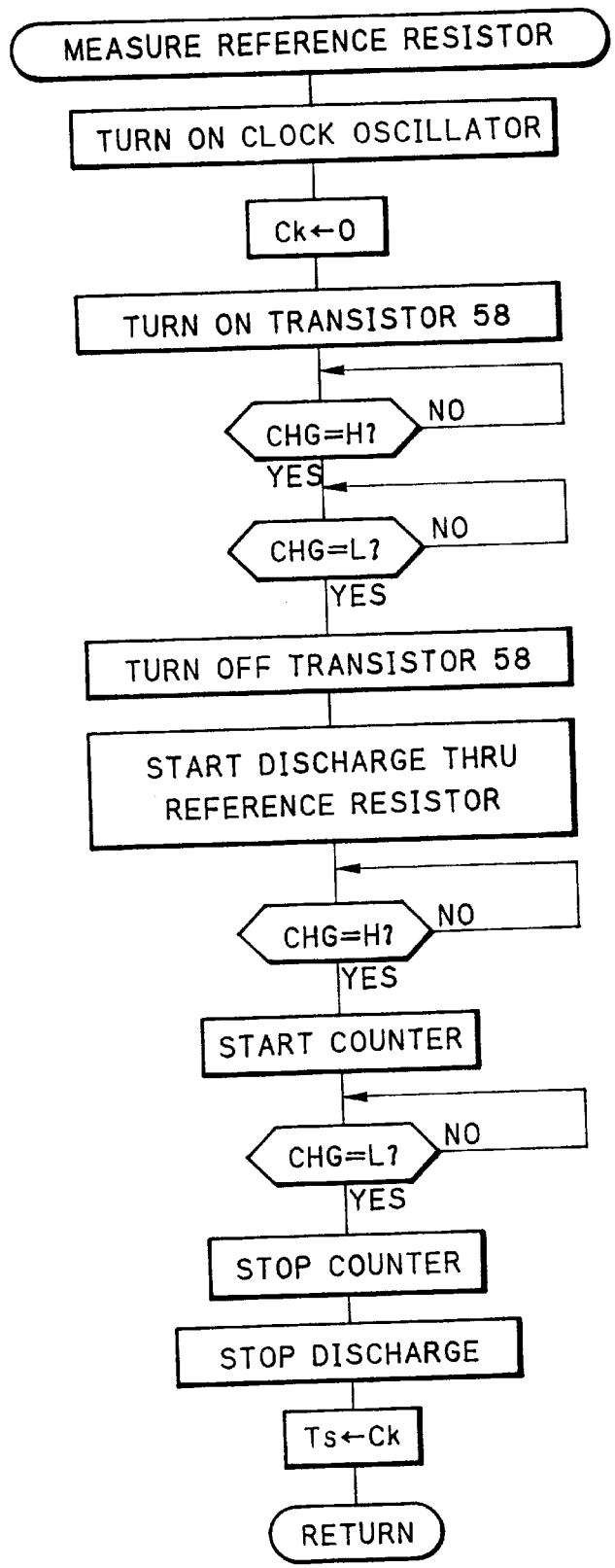

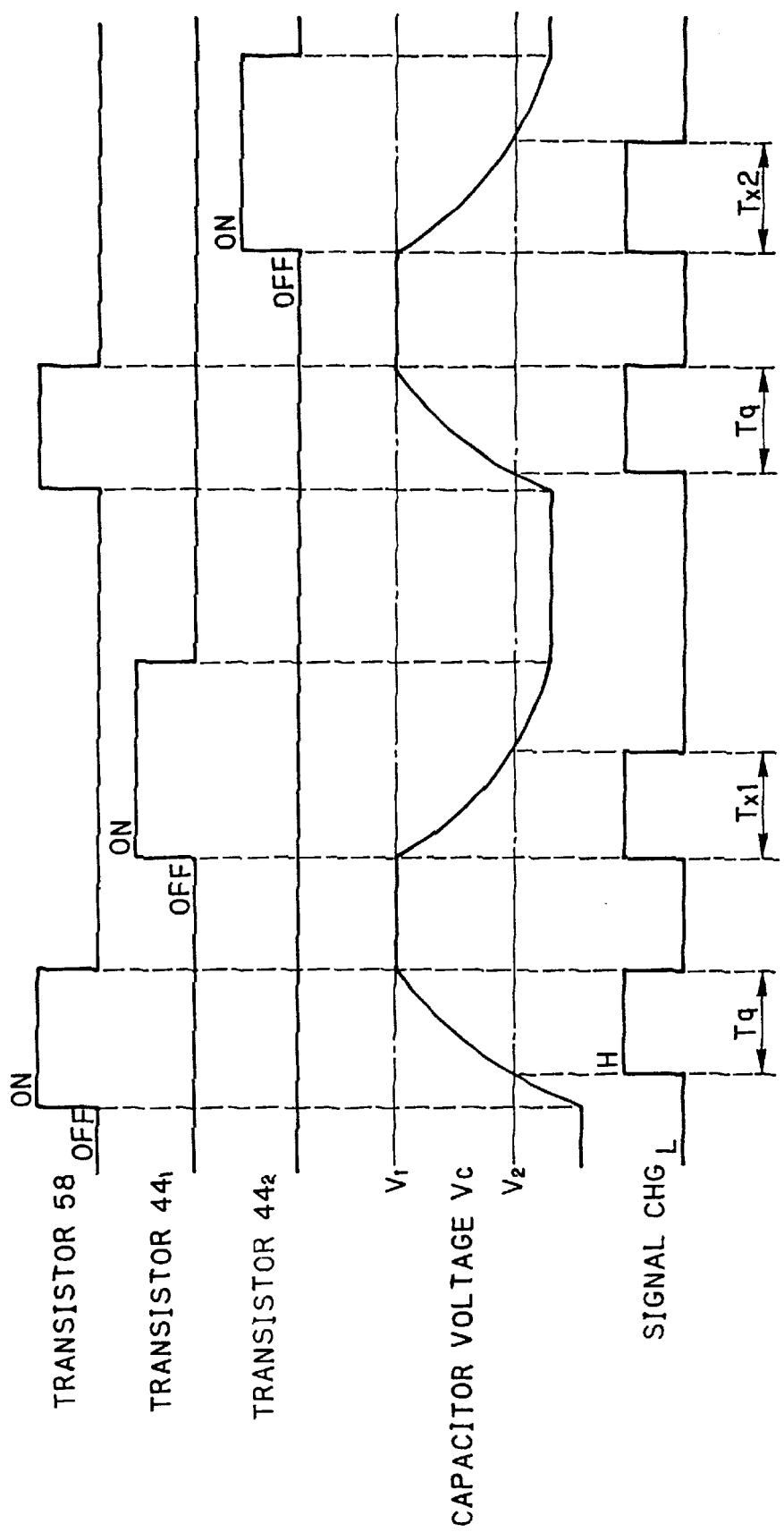

THERMAL PRINTER AND RESISTANCE DATA MEASURING DEVICE FOR THERMAL HEAD OF THE SAME

BACKGROUND OF THE INVENTION

1. Field of the Invention

The present invention relates to a thermal printer and a resistance data measuring device for a thermal head of the same. More particularly, the present invention relates to a thermal printer in which irregularity in performance of heating elements of a thermal head can be overcome in a printing operation, and a resistance data measuring device for a thermal head of the thermal printer.

2. Description Related to the Prior Art

Conventional thermal printers include a thermal transfer printer in which ink film is used, and a direct thermal printer in which thermosensitive recording material is heated for directly printing an image.

The color thermal printer of the direct printing uses a color thermosensitive recording material or recording sheet, in which thermosensitive coloring layers of magenta, yellow and cyan are formed on a support. To develop colors on the coloring layers, the amount of heat energy (in $mJ/mm^2$) applied to the coloring layers is varied. The lowest heat energy is required for coloring one of the coloring layers located at the obverse of the recording sheet. Higher heat energy is required for coloring the coloring layers according to the closeness to the support. Once a coloring layer is heated, electromagentic rays are applied to that layer to fix it before heat energy is applied for coloring the next layer to be colored. This process is performed to inhibit further coloring by the present coloring layer, effectively preventing that layer from being colored beyond a desired density.

The thermal head includes an array of heating elements as resistors, which are arranged to record pixels arranged in one line. To record an image of each color thermally, heat energy is applied to the recording sheet as a sum of bias heat energy and image heat energy. The bias heat energy has an amount slightly short of causing the coloring layer to develop the one color, and is applied to the recording sheet during the bias heating at the beginning of recording each one pixel. The image heat energy has an amount determined according to the gradation level of one color, namely coloring density of the pixel to be printed, and is applied to the recording sheet during the image heating which succeeds the bias heating.

To reproduce high gradation, the heating operation is controlled finely. The heating elements of the thermal head need to have an equal resistance for the purpose of precise application of the heat as controlled. It is however inevitable that the heating elements have irregularity of 5–10% in resistance. If the heating elements are driven for an equal duration, generated heat energy differs between the heating elements due to the differences in the resistance. Irregularity in density is likely to occur in an image being recorded.

U.S. Pat. No. 5,469,068 (corresponding to JP-A 6-79897) discloses a thermal printer in which the resistance of the heating elements is measured for the purpose of preventing occurrence of irregularity in printed density by compensating image data. The thermal printer is provided with a capacitor having a known capacitance. The capacitor is charged fully, and then discharged via the heating elements connected thereto. The time for a capacitor voltage to decrease is measured. For example, the decrease of the capacitor voltage down to a half of a power source voltage is checked to measure the discharging time. According to the discharging time and the capacitance of the capacitor, the resistance of the heating elements is calculated in view of a proportional relationship between the discharging time and the resistance of the heating elements.

This prior document also suggests use of a reference resistor to which the capacitor is connected, and of which resistance is known. The capacitor is charged fully, and then discharged via the reference resistor. The discharging time for decrease in the capacitor voltage is measured until a predetermined voltage is reached. Again the capacitor is charged fully and discharged via the heating elements. The discharging time for decreasing the capacitor voltage is measured until the predetermined voltage is reached. According to the resistance of the reference resistor and the discharging times via the reference resistor and the heating elements, the resistance of the heating elements is calculated.

According to U.S. Pat. No. 5,469,068 (corresponding to JP-A 6-79897), the capacitor is fully charged by applying voltage for a predetermined duration, and then discharged down from the capacitor voltage equal to the power source voltage, until the discharging time is measured. To measure the resistance of the heating elements with precision, the duration for the charging operation should be long enough to ensure full charging. A problem of the prior art lies in considerable slowness of measuring the resistance of all the heating elements. If the duration for the charging operation is shortened, the capacitor voltage upon the finish of the charging is not kept equal due to the charge having initially remained in the capacitor. Another problem lies in low precision in the measurement of the resistance.

SUMMARY OF THE INVENTION

In view of the foregoing problems, an object of the present invention is to provide a thermal printer in which irregularity in performance of heating elements of a thermal head can be overcome in a printing operation, and a resistance data measuring device for a thermal head of the thermal printer.

Another object of the present invention is to provide a thermal printer in which resistance of heating elements can be measured precisely and quickly, and a resistance data measure device for a thermal head of the thermal printer.

In order to achieve the above and other objects and advantages of this invention, a thermal head has plural heating elements arranged along a line and connected in parallel with one another. A respective one of the heating elements is connected to one of plural heat control switches. The heat control switches are selectively turned on/off for driving the heating elements individually by applying electrical energy to generate heat. A capacitor is connected in parallel with the plural heating elements. A charging switch is adapted to charging the capacitor. A voltage detector detects a capacitor voltage across the capacitor. A reference resistor is connected in parallel with the plural heating elements and the capacitor. An additional switch is connected to the reference resistor. A control circuit controls the heat control switches, the charging switch and the additional switch. The control circuit initially turns on the charging switch to charge the capacitor. The charging switch is turned off to stop charging the capacitor upon an increase of the capacitor voltage to a predetermined high voltage. One selected from a group including the additional switch and the plural heat control switches is thereafter turned on, to discharge the capacitor via the reference resistor or one of the heating elements in association with the selected one being turned on. A timer measures discharging time elapsed in a decrease of the capacitor voltage from the predetermined high voltage to a predetermined low voltage while the capacitor is discharged, in association respectively with the reference resistor and the heating elements. A resistance data determiner determines resistance data of the heating elements in accordance with the discharging time respectively of the heating elements with reference to the discharging time of the reference resistor.

In a preferred embodiment, the resistance data is a ratio of the discharging time of each of the heating elements to the discharging time of the reference resistor, and represents a relative greatness of resistance.

The resistance data measure device is incorporated in a thermal printer in which the heating elements are respectively driven by a drive signal based on bias data and image data, to effect thermal recording to recording material. The thermal printer further includes a compensator for compensating the drive signal associated with the heating elements, in accordance with the resistance data determined by the resistance data determiner.

In a variant, a reference resistor is connected to the charging switch in series. A control circuit controls the heat control switches and the charging switch. The control circuit initially turns on the charging switch to charge the capacitor via the reference resistor, turns off the charging switch to stop charging the capacitor, and thereafter turns one selected from the plural heat control switches, to discharge the capacitor via one of the heating elements in association with the selected one being turned on. A timer measures charging time elapsed in an increase of the capacitor voltage from a predetermined low voltage to a predetermined high voltage while the capacitor is charged. The timer measures discharging time elapsed in a decrease of the capacitor voltage from the predetermined high voltage to the predetermined low voltage while the capacitor is discharged, in association respectively with the heating elements. A resistance data determiner determines resistance data of the heating elements in accordance with the discharging time with reference to the charging time.

It is preferable in the variant that the control circuit turns off the charging switch upon an increase of the capacitor voltage to the predetermined high voltage while the charging switch is turned on.

BRIEF DESCRIPTION OF THE DRAWINGS

The above objects and advantages of the present invention will become more apparent from the following detailed description when read in connection with the accompanying drawings, in which:

FIG. 3 is an explanatory sectional view, illustrating layers of a color thermosensitive recording sheet;

FIG. 4 is a graph illustrating coloring characteristics of the recording sheet;

FIG. 5 is a block diagram schematically illustrating an electrical construction of the thermal printer;

FIG. 7 is a flow chart illustrating measurement of discharging time via the reference resistor;

FIG. 12 is a time chart illustrating signal waveforms during measurement of the charging and discharging times.

DETAILED DESCRIPTION OF THE PREFERRED EMBODIMENT(S) OF THE PRESENT INVENTION

Figure 1:
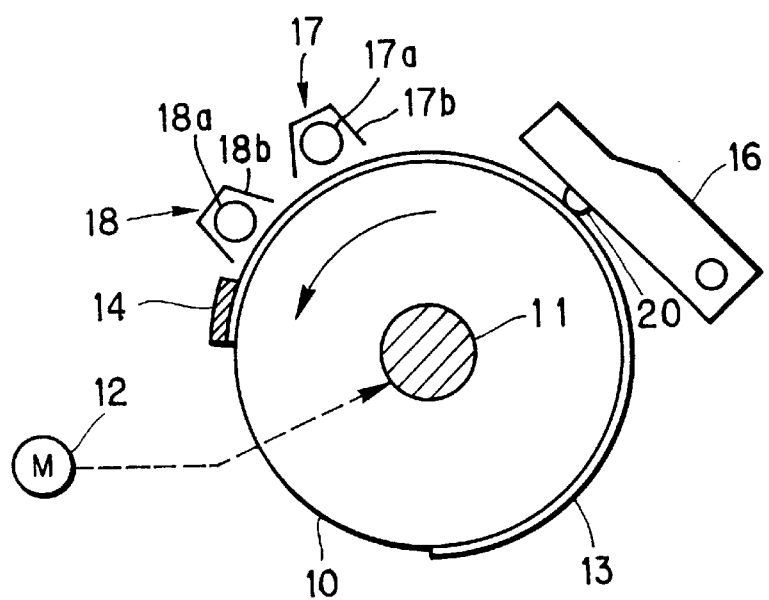
FIG. 1 is an explanatory view in elevation, illustrating a mechanical construction of a color thermal printer.

In FIG. 1, a platen drum 10 is mounted about a rotational shaft 11, and rotated by a stepping motor 12 in a sub-scanning direction indicated by the arrow. A color thermosensitive recording sheet 13 is mounted on a periphery of the platen drum 10. A front edge of the recording sheet 13 is fixedly retained on the platen drum 10 by a damper 14. The damper 14 is movable between a position on the platen drum 10 for the retention of the recording sheet 13 and a position away from the platen drum 10.

Figure 2:
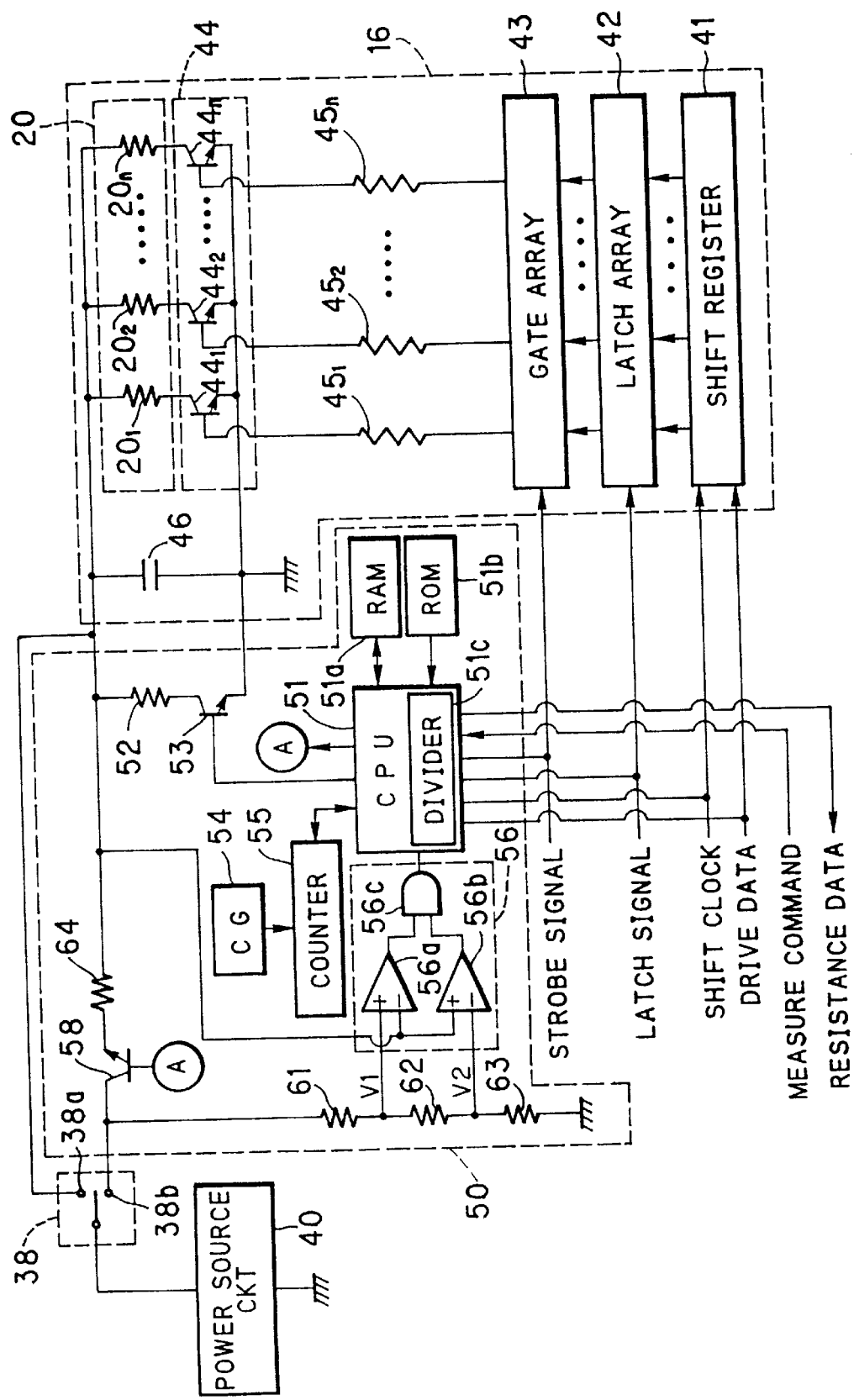
FIG. 2 is a block diagram schematically illustrating a resistance data measuring device and circuits relevant to a thermal head.

Near to the periphery of the platen drum 10, there are disposed a thermal head 16, a yellow fixing optical device 17, and a magenta fixing optical device 18. In FIG. 2, the thermal head 16 includes a heating element array 20 in which heating elements $20_1$–$20_n$ are arranged along one line in a main scanning direction, namely in parallel with the axis of the platen drum 10. At the time of printing, the heating element array 20 is pressed against the recording sheet 13. The yellow fixer 17 includes an ultraviolet lamp 17a and a lamp housing 17b. The lamp 17a emanates ultraviolet rays peaking at the wavelength of 420 nm. The magenta fixer 18 includes an ultraviolet lamp 18a and a lamp housing 18b. The lamp 18a emanates ultraviolet rays peaking at the wavelength of 365 nm.

In FIG. 3 illustrates a layered structure of the recording sheet 13. The recording sheet 13 includes a support 23, a cyan coloring layer 24, a magenta coloring layer 25, a yellow coloring layer 26 and a protective layer 27 disposed in the order listed. The magenta coloring layer 25 has optical fixability responsive to ultraviolet rays of a wavelength range of nearly 365 nm. The yellow coloring layer 26 has optical fixability responsive to ultraviolet rays of a wavelength range of nearly 420 nm. The recording operation is effected in the order from the obverse toward the support 23, namely in the order of yellow, magenta and cyan successively. It is also possible to use an alternative recording sheet including the support 23, the cyan coloring layer 24, the yellow coloring layer 26, M represents that magenta coloring layer 25, and C represents the cyan coloring layer 24.

There are intermediate layers which are disposed between the coloring layers 24–26 for regulating thermal sensitivity of the coloring layers 24–26, but which are not shown in the drawing. The support 23 consist of a piece of opaque coated paper or plastic film. Also transparent plastic film may be used for producing an OHP sheet adapted to an overhead projector (OHP).

FIG. 4 illustrates coloring characteristics of the coloring layers 24–26. Higher heat energy is required for coloring the coloring layers 24–26 according to the closeness to the support 23. The lowest heat energy is required for the yellow coloring layer 26. The highest heat energy is required for the cyan coloring layer 24. To record a yellow pixel thermally, heat energy is applied to the recording sheet 13 as a sum of bias heat energy Eby for yellow and image heat energy Egy for yellow.

The bias heat energy Eby has an amount slightly short of causing the yellow coloring layer 26 to develop the yellow color, and is applied to the recording sheet 13 during the bias heating at the beginning of recording each one pixel. The image heat energy Egy has an amount determined according to the gradation level of yellow, namely yellow coloring density of a pixel to be printed, and is applied to the recording sheet 13 during the image heating which succeeds the bias heating. Similarly the bias heating and the image heating are effected by applying magenta bias heat energy Ebm, magenta image heat energy Egm, cyan bias heat energy Ebc and cyan image heat energy Egc.

FIG. 5 schematically illustrates the color thermal printer. A system controller 30 effects preset sequences, and controls a section for the thermal recording, a resistance data measuring device 50 (see FIG. 2) the stepping motor 12, the yellow fixer 17 and the magenta fixer 18. The thermal recording section includes a printing controller 36, and also the thermal head 16, an image memory group 31, a color corrector 32, a resistance change compensator 33, a line memory 34 and a comparator 35, which are sequentially controlled by the printing controller 36.

The image memory group 31 includes a yellow image memory 31a, a magenta image memory 31b and a cyan image memory 31c, which are controlled by a memory controller incorporated in the printing controller 36, for writing and reading image data. An image to be printed is measured by a scanner (not shown) according to three-color separation photometry, and converted into image data of 8 (eight) bits per color to be input to the image memory group 31. Yellow image data is written to the yellow image memory 31a. Magenta image data is written to the magenta image memory 31b. Cyan image data is written to the cyan image memory 31c. In printing operation, the three-color image data of one line to be recorded is read from the image memory group 31, and sent into the color corrector 32.

The color corrector 32 receives the three-color image data, effects the color correction, and sends the resistance change compensator 33 image data of each color to be recorded. Note that it is possible to write Red, Green and Blue image data to the image memory group 31, and to operate the color corrector 32 both for complementary color conversation and for the color correction, so as to obtain the yellow, magenta and cyan image data.

The resistance change compensator 33 includes an EEPROM (electrically erasable programmable read-only memory) 33a, a RAM (read-only memory) 33b and a ROM (random access memory) 33c. EEPROM 33a operates to store resistance data Di (I=1, 2, . . . ,n). ROM 33c stores fundamental bias data of each color. The fundamental bias data is compensated according to the resistance data Di. In the course of assembly and adjustment of the thermal printer, the resistance data Di is determined by the resistance data measuring device 50 and written to EEPROM 33a.

Inevitably, there occurs variety in the resistance between the actual heating elements $20_1$–$20_n$ of the heating element array 20 actually manufactured, no matter precisely their resistance is equally regulated during manufacturing. Changes or irregularities are created in a recorded image due to the variety in the resistance, because heat energy from the heating elements has conspicuous differences causing improper appearance in the image. Errors in the heat energy due to change in the resistance include error in the bias heat energy occurring during the bias heating, and an error in the image heat energy occurring during the image heating.

To eliminate bias heat energy error as an error in the bias heating, the resistance change compensator 33 utilizes the resistance data Di of EEPROM 33 to create one-line compensated bias data by compensating the fundamental bias data from ROM 33c, and writes the compensated bias data to RAM 33b. Image heat energy error, as an error in the image heating, depends on the highness of the image data. Once the one-line image data is written to RAM 33b, the resistance change compensator 33 calculates the image heat energy error in accordance with the image data stored in RAM 33b and the resistance data Di. Again, the compensated bias data of RAM 33b is compensated according to the image heat energy error, to create one-line bias data. For the bias heating, the resistance change compensator 33 sends the one-line bias data to the line memory 34. For the image heating, the resistance change compensator 33 reads the one-line image data from RAM 33b, and sends it to the line memory 34.

To the line memory 34, the bias data or the image data for the one line is written. The bias data or the image data for the one line is read from the line memory 34 sequentially pixel-by-pixel, and sent to the comparator 35. The comparator 35 includes a counter for generating comparison data. In response to a count-up signal from the printing controller 36, the counter steps up the count by one. The number of the grades of the gradation may be 256, so that the counter may generate the comparison data of 1–255. The comparator 35 effects comparison between the bias data or the image data for the one line and a series of the comparison data, and successively pixel-after-pixel. If the bias data or the image data is greater than the comparison data, then the comparator 35 generates drive data of 1 (one). If the bias data or the image data is smaller than the comparison data, then the comparator 35 generates drive data of 0 (zero).

For the bias heating, the bias data of one line is compared for 255 times with the comparison data of 1–255. The bias data of one pixel is converted to drive data of, at most, 255 pulses. For the image heating, the image data of the one line is compared for 255 times. The image data of one pixel is converted to drive data of at most 255 pulses. The comparator 35 outputs the one-line drive data in a serial form and sends it to the thermal head 16.

A selector switch 38 is controlled by the system controller 30, and set on the side of a terminal 38a for the thermal head 16 to a power source circuit 40, which supplies electric power to drive the heating elements $20_1$–$20_n$. The selector switch 38 is set on the side of a terminal 38b for operation of resistance measurement. For determination of the resistance data Di of the heating elements $20_1$–$20_n$ the terminal 38b is operated for the resistance data measuring device 50 to control the supply of the power to the thermal head 16.

As shown, in FIG. 2, the thermal head 16 includes a shift register 41, a latch array 42, an AND gate array 43, a heat control switch array 44 and the heating element array 20. The shift register 41 fetches the one-line serial drive data while shifting it successively upon the shift clock pulses, and converts it to the drive data of a parallel form, as an output toward the latch array 42.

The drive data having the parallel form from the shift register 41 is latched by the latch array 42 in synchronism with a latch signal, and sent to the gate array 43. A strobe signal for the bias heating is sent to the gate array 43 during the bias heating. A strobe signal for the image heating is sent to the gate array 43 during the image heating. The gate array 43 determines a logical product of the strobe signal and the drive data from the latch array 42 at each bit, and sends the logical product to the heat control switch array 44 via resistors 45–45. A drive pulse is generated at a width of the strobe signal if the bit has the drive data of 1, and is not generated if the bit has the drive data of 0. The pulse width of the strobe signal is set different between the three colors. Note that the shift clock pulse, the latch signal and the strobe signal are generated from the printing controller 36.

The heat control switch array 44 consists of heat control transistors $44_1$–$44_n$, as switches respectively associated with the heating elements $20_1$–$20_n$. The heat control transistors $44^1$–$44_n$ are turned on when a drive pulse is output from an associated one of the gate array 43. An associated one of the heating elements is energized to apply heat for printing by turning on of one of the heat control transistors $44_1$–$44_n$.

A noise absorbing capacitor 46 is connected in parallel with the heating elements $20_1$–$20_n$. The capacitor 46 absorbs electrical noise occurring through a power source line between the thermal head 16 and the power source circuit 40 disposed inside the thermal printer, and regulates the voltage applied to the heating element array 20. The heat energy from the heating elements $20_1$–$20_n$ would be changed according to changes of the applied voltage across the heating element array 20. The recording sheet could not be colored at desired density.

As shown in FIG. 2, the resistance data measuring device 50 includes a CPU 51 as a control circuit, a reference resistor 52, an additional transistor 53, a clock oscillator or clock generator (CG) 54, a counter 55 as a timer, a window comparator 56 as a voltage detector, a charging transistor 58 and a resistor 64. The reference resistor 52 has resistance Rs being known. The resistance data measuring device 50 also utilizes the capacitor 46 of thermal head 16 for the noise absorption, and measures the resistance data Di of the heating elements 20—20. The reference resistor 52 is connected, in series, with the additional transistor 53. The series connection between the reference resistor 52 and the additional transistor 53 is connected, in parallel, with the capacitor 46 of the thermal head 16. The additional Transistor 53 is controlled by CPU 51 to be turned on/off in measuring the resistance data Di. The resistance Rs of the reference resistor 52 has high precision and high quality, and has small errors such as 1%. The determination of the resistance data Di does not depend on the resistance Rs of the reference resistor 52, which can be set as desired for design.

The charging transistor 58 is connected between the power source circuit 40 and the capacitor 46 as a charging switch for the capacitor 46. CPU 51 keeps the charging transistor 58 turned off during the printing, and switches the charging transistor 58 on and off during the measurement of the resistance.

The window comparator 56 detects a capacitor voltage Vc at which the capacitor 46 is charged, and is constituted by a first comparator 56a, a second comparator 56b and an AND gate 56c. One electrode of the capacitor 46 is connected to an inverting input terminal of the first comparator 56a and to a non-inverting input terminal of the second comparator 56b. Potential dividing resistors 61, 62 and 63 are connected in series for dividing potential of power supply voltage EH of the power source circuit 40. A non-inverting input terminal of the first comparator 56a is connected to a line between the resistors 61 and 62. An inverting input terminal of the second comparator 56b is connected to a line between the resistors 62 and 63.

A predetermined high voltage V1, which is smaller than Eh, is input to a non-inverting input terminal of the first comparator 56a as a reference voltage, which is obtained by potential division of the power supply voltage EH of the power source circuit 40. A predetermined low voltage V2, which is even smaller than V1, is input to an inverting input terminal of the second comparator 56b as a reference voltage, which is obtained by the potential division. Outputs of the comparators 56a and 56b are sent to the AND gate 56c, which outputs the signal CHG and sends it to CPU 51. The signal CHG, as an output of the window comparator 56, has a "High" level only when the capacitor voltage Vc across the capacitor 46 is between the predetermined voltages V1 and V2.

While the charging transistor 58 is turned on, the capacitor 46 is supplied with electrical charge by the power source circuit 40 via the resistor 64, and charged. At the printing time, the selector switch 38 is changed over to connect the power source circuit 40 directly to the power source terminal of the thermal head 16. The power supply voltage EH of the power source circuit 40 is applied directly to the heating elements 20—20. The heating elements 20—20 generate the greater heat energy at one time because the current does not flow along the resistor 64. Time required for the printing is therefore prevented from being extended.

To measure the discharging time of the capacitor 46, the counter 55 is connected to CPU 51. The clock generator 54 is connected to the counter 55 for generating clock pulses of a constant frequency. A count Ck of the counter 55 is reset by CPU 51 to 0 (zero). CPU 51 controls the counter 55 for starting and stopping of the counting operation.

In the measurement of the discharging time, CPU 51 operates to charge the capacitor 46 according to the signal CHG until the capacitor voltage Vc rises to the predetermined high voltage V1. Then the capacitor 46 is discharged via the reference resistor 52 or a selected one of the heating elements $20_1$–$20_n$. During the discharge, the counter 55 counts the number of clock pulses generated while the capacitor voltage Vc changes from the predetermined high voltage V1 to the predetermined low voltage V2. The count Ck obtained by measuring the reference resistor 52 is discharging time Ts. The count Ck obtained by measuring the reference resistor 52 is discharging time Ts. The count Ck obtained by measuring the heating elements $20_1$–$20_n$ by use of the discharging times Ts and Txi stored in RAM 51a, and sends the resistance data Di to the resistance change compensator 33.

A ROM 51b stores one-line drive data for the purpose of resistance measurement. To measure discharging time via each of the heating elements $20_1$–$20_n$, CPU 51 reads the one-line drive data from ROM 51b, to drive only a designated one of the heating elements. The drive data is sent to the thermal head 16. Also CPU 51 generates the shift clock pulse, the latch signal and the strobe signal. To measure discharging time via the reference resistor 52, the additional transistor 53 is turned on.

The operation of the above construction is described now. The resistance data Di is measured at the time of assembly and adjustment of the color thermal printer. When the printer is initially powered, the system controller 30 commands the resistance data measuring device 50 to measure the resistance data Di in response to checking selection of the measurement at the selector switch 38.

Figure 6:
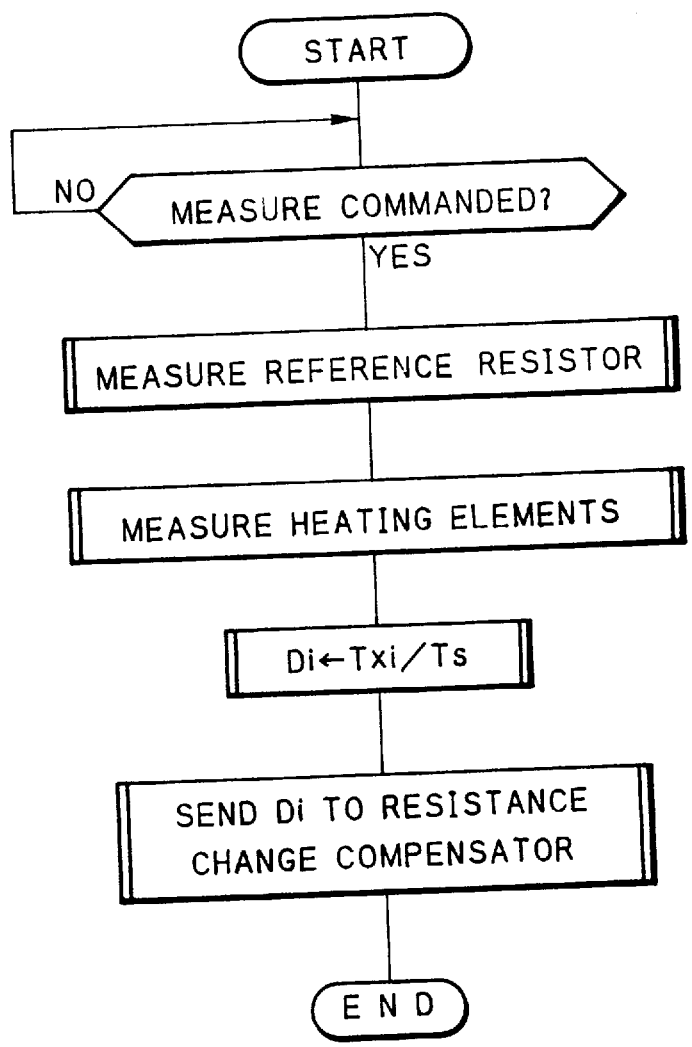
FIG. 6 is a flow chart illustrating determination of resistance data.
Figure 8:
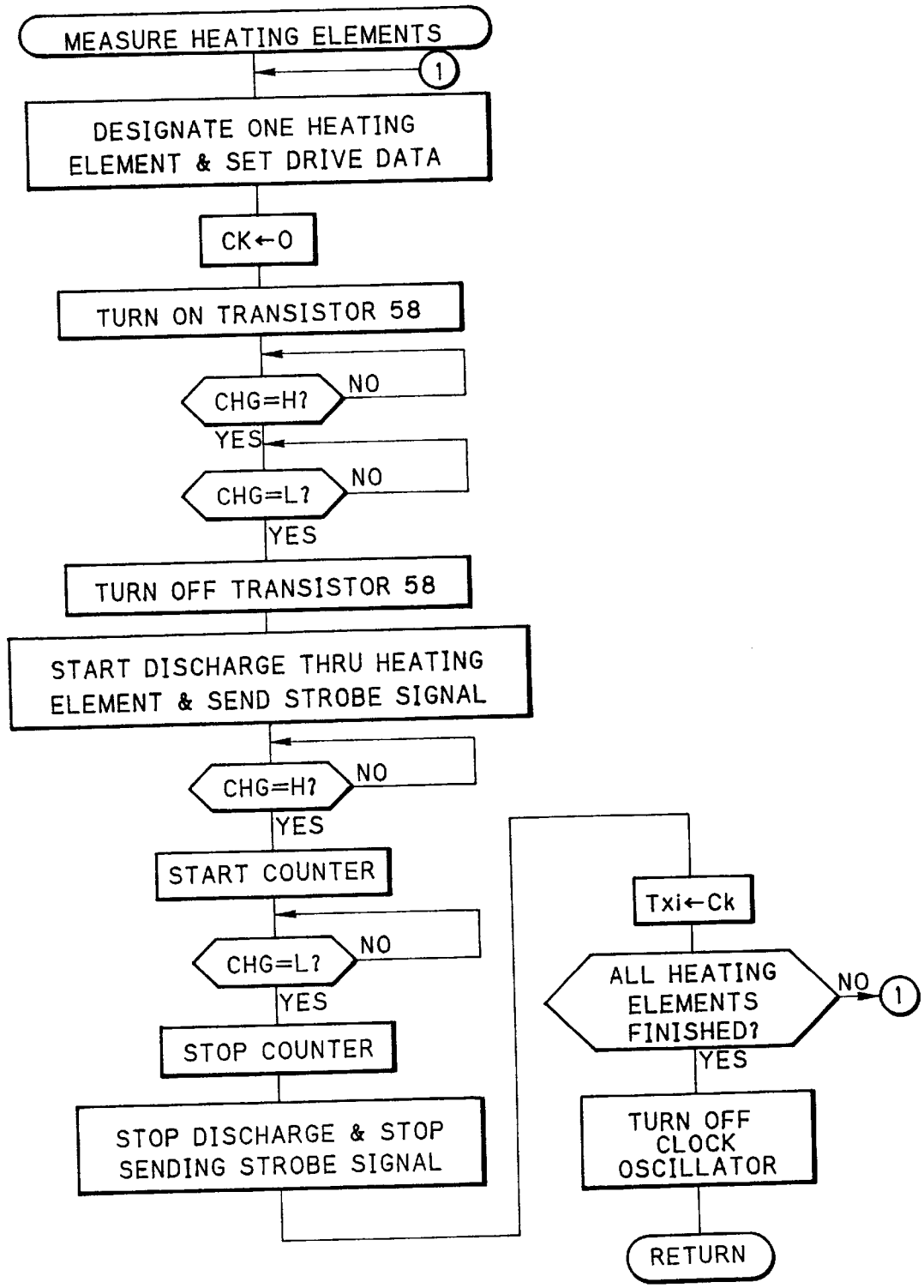
FIG. 8 is a flow chart illustrating measurement of discharging time via each heating element.

When the measurement of the resistance data Di is commanded, CPU 51 effects the sequences of FIGS. 6, 7 and 8 to measure the resistance data Di of the heating elements $20_1$–$20_n$. At first CPU 51 controls operators to measure the resistance of reference resistor 52, by measuring the discharging time Ts of the capacitor 46 via the reference resistor 52. In FIG. 7, CPU 51 turns on the clock generator 54, which sends the clock pulse to the counter 55 at the constant period.

Figure 9:
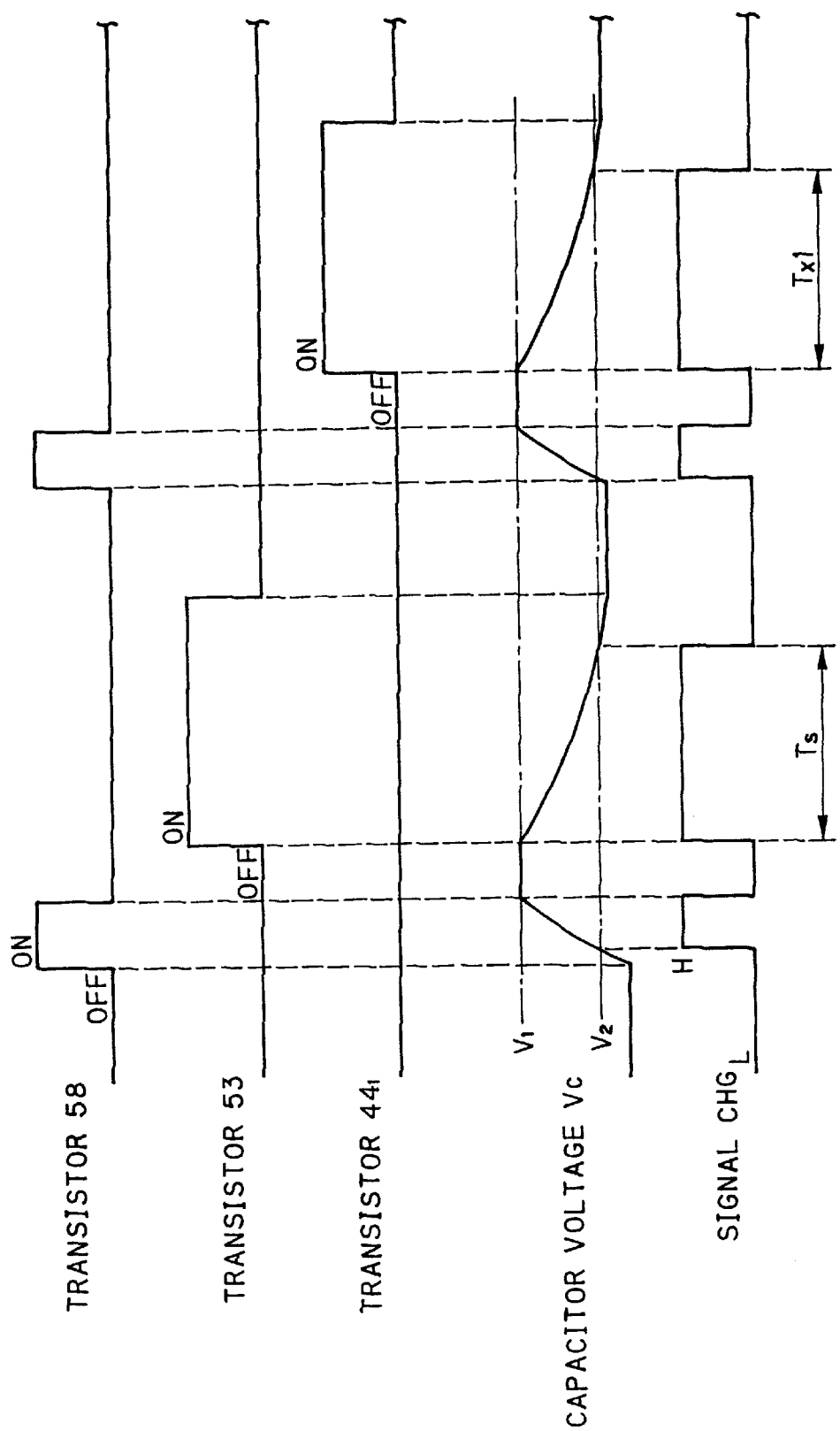
FIG. 9 is a timing chart illustrating signal waveforms during measurement of the discharging times.

Then CPU 51 resets the count Ck of the counter 55 as 0 (zero), and turns on the charging transistor 58. The thermal head 16 is supplied with current by the power source circuit 40 via the resistor 64. Also the capacitor 46 is charged. In FIG. 9, the capacitor voltage Vc across the capacitor 46 gradually increases at a ratio of change according to the resistance of the resistor 64. When the capacitor voltage Vc exceeds the predetermined low voltage V2, the signal CHG from the window comparator 56 changes from the "Low" level to the "High" level. In the course of further charging, the capacitor voltage Vc ultimately exceeds the predetermined high voltage V1. In response, the signal CHG becomes "Low". Immediately after the signal CHG becomes "Low", CPU 51 turns off the charging transistor 58, to stop charging the capacitor 46.

Note that the capacitor 46 can be pre-discharged in preparatory fashion by turning on the heat control transistors 44—44 of the heat control switch array 44 before the charging transistor 58 is turned on. It is possible to avoid an erroneous operation in which the capacitor 46 is charged with the capacitor voltage Vc accidentally exceeding the predetermined low voltage V2.

It is possible to minimize the duration of charging the capacitor 46, by discontinuing the charge applied to the capacitor 46 when the capacitor voltage Vc reaches the predetermined high voltage V1. The charging time depends on the capacitance of the capacitor 46, resistance of the resistor 64, the power supply voltage EH and the predetermined high voltage V1. According to the present embodiment, the charging time is 2 msec. After the charging is stopped, CPU 51 turns on the additional transistor 53 connected to the reference resistor 52. In response, current flows between the reference resistor 52 and the capacitor 46, which is discharged via the reference resistor 52.

The capacitor voltage Vc across the capacitor 46 is gradually lowered by the discharge. When the capacitor voltage Vc becomes slightly lower than the predetermined high voltage V1, the signal CHG becomes "High". In response, CPU 51 sends a command to the counter 55 to start counting. The counter 55 increments the count Ck by one each time one clock pulse is sent from the clock generator 54.

In the course of discharging the capacitor 46, the capacitor voltage Vc across the capacitor 46 comes down to the predetermined low voltage V2. In response, the signal CHG becomes "Low". The CPU 51 sends a stop command to the counter 55, to stop the counter 55 from counting. According to the present embodiment, the discharging time of the change of the capacitor voltage Vc from the predetermined high voltage V1 to the predetermined low voltage V2 is 10 msec.

After the counter 55 stops counting, CPU 51 turns off the additional transistor 53 to sto the discharge of the capacitor 46. Then CPU 51 reads the count Ck from the counter 55, sets it for the discharging time Ts, an writes it to RAM 51a. The discharging time Ts is a duration lapsed while the capacitor voltage Vc across the capacitor 46 changes from the predetermined low voltage V2 during the discharge via the reference resistor 52.

After the discharging time Ts is stored, CPU 51 effects the sequence for measuring the discharging time of the capacitor 46 via the heating elements $20_1$–$20_n$. At first CPU 51 measures the heating element 20. In FIG. 8, CPU 51 sends one-line drive data to the shift register 41 in synchronism with the shift clock pulses. The one-line drive data used presently has 1 (one) only at a bit associated with the heat control transistor 44, to turn on the heat control transistor 44 and turn off the heat control transistors $44_1$–$44_n$. Then CPU 51 sends the latch signal to the latch array 42, which latches the one-line drive data as set I the shift register 41.

After the latch signal is sent, CPU 51 resets the count Ck of the counter 55 as 0 (zero), and then turns on the charging transistor 58. Again the capacitor 46 is charged. In a manner similar to the reference resistor 52, the charging operation is stopped as soon as the capacitor voltage Vc becomes the predetermined high voltage V1.

After the charging, CPU 51 sends the strobe signal to the gate array 43 of the thermal head 16. The gate array 43 is provided by the latch array 42 with the drive data for turning on the heat control transistor 44 and turning off the heat control transistors $44_1$–$44_n$. Upon supply of the strobe signal from CPU 51, the gate array 43 sends a drive pulse to the heat control transistor 44. Only the heat control transistor 44 is turned on for the current to flow from the capacitor 46 to the heating element 20. the capacitor 46 is discharged via the heating element 20.

The capacitor voltage Vc across the capacitor 46 is gradually lowered by the discharge. When the capacitor voltage Vc becomes slightly lower than the predetermined high voltage V1, the signal CHG becomes "High". Like the operation to measure the discharging time Ts at the reference resistor 52, CPU 51 sends the start command to the counter 55, to measure the discharging time. When the capacitor voltage Vc comes down to the predetermined low voltage V2, the signal CHG becomes "Low". CPU 51 sends the stop command to the counter 55, to stop measuring the discharging time.

After the counter 55 stops counting, CPU 51 stops sending the strobe signal, turns off the heat control transistor 44, and stops discharge via the heating element 20. The count Ck is read, and written to Ram 51a as a discharging time T×1 of the heating element 20. The discharging time T×1 is time of the change of the capacitor voltage Vc from the predetermined high voltage V1 down to the predetermined low voltage V2 during the discharge of the capacitor 46 via the heating element 20.

CPU 51 starts the measurement of the heating element 20 next. CPU 51 provides the shift register 41 with one-line drive data in synchronism with the shift clock pulse. The one-line drive data is set to turn on the heat control transistor 44 and turn off the heat control transistors 44 and $44_1$–$44_n$. CPU 51 sends the latch array 42 the latch signal to latch the one-line drive data having been set in the shift register 41.

After the drive data is latched, the capacitor 46 is charged and discharged via the heating element 20 in a similar manner to the heating element 20. A discharging time T×2 is measured according to the change in the signal CHG, and written to RAM 51a. Repetitively discharging times T×3, T×4, . . . T×n are measured with respect to the heating elements $20_1$–$20_n$, and are written to RAM 51a.

As described above, the discharging times Ts and T×1–T×n associated with the reference resistor 52 and the heating elements $20_1$–$20_n$ are measured. In charging the capacitor 46, the capacitor voltage Vc is detected by the window comparator 56. The charging of the capacitor 46 is stopped upon rise of the capacitor voltage Vc to the predetermined high voltage V1. This is effective in shortening durations required for measurement of the reference resistor 52 and the heating elements $20_{1-20n}$. It is possible for example to spend only 7 seconds in measuring the 512 heating elements. In the present embodiment, the discharging time is measured according to the detection of the capacitor voltage Vc at the window comparator 56. The capacitor voltage Vc can be maintained at the predetermined high voltage V1 at the beginning of the measurement. No error occurs in the measurement, as there are no changes in the power supply voltage or no irregularity in the capacitor voltage.

The capacitor 46 is prevented from being fully charged, as the capacitor voltage Vc across the capacitor 46 is detected to limit the maximum at the predetermined high voltage V1. It is possible to lower the voltage applied to the heating elements $20_1$–$20_n$ during the discharge, and to reduce the electrical stress to the heating elements $20_1$–$20_n$ are prevented from degradation. Note that the reference resistor 52 is measured before measuring the heating elements $20_1$–$20_n$, but may be measured after measuring all the heating elements $20_1$–$20_n$.

After the measurement of the discharging time Txi (i=1,2, . . . ,n) is finished for all the heating elements $20_1$–$20_n$, CPU 51 reads the discharging times Ts and Txi from RAM 51a. The divider 51c as a resistance data determiner calculates the resistance data Di (i=1,2, . . . ,n) for each of the heating elements $20_1$–$20_n$ according to the formula:

$$Di=Txi/Ts.$$

The resistance data Di, as determined, is sent from CPU 51 to the resistance change compensator 33, and written to EEPROM 33a. The resistance data Di itself is not resistance of the heating elements $20_1$–$20_n$, but represents a relative size of the resistance of the heating elements $20_1$–$20_n$.

The definition above of the resistance data Di is described now in detail. The capacitor 46 is charged up to a certain voltage E that is higher than the predetermined high voltage V1, and is discharged via the reference resistor 52 having the resistance Rs. Assuming the capacitor 46 has capacitance C, a relationship between the capacitor voltage Vc across the capacitor 46 and a discharging time t is expressed as:

$$Vc=E \cdot exp(-t/Rs \cdot C) \quad (1).$$

Assuming t1 represents the time taken for the capacitor voltage Vc to decrease to the predetermined high voltage V1 in the discharge of the capacitor 46 via the reference resistor 52 and t2 represents the time taken for the capacitor voltage V2 to decrease to the predetermined low voltage V2 in the discharge via the reference resistor 52, the predetermined voltages V1 and V2 are expressed as follows:

$$V1=E \cdot exp(-t1/Rs \cdot C) \quad (2),$$

and $$V2=E \cdot exp(-t2/Rs \cdot C) \quad (3).$$

The discharging time Ts is equal to a difference (t2–t1) of time, and thus is expressed as Formula (4). The resistance Rs is expressed as Formula (5).

$$Ts=t2-t1=C \cdot Rs \cdot ln(V1/V2) \quad (4).$$

$$Rs=Ts/[C \cdot ln(V1/V2)] \quad (5).$$

The predetermined voltages V1 and V2 are supplied by division of the potential of the power supply voltage EH. V1 and V2 can be defined by use of coefficients E1 and E2:

$$V1=E1 \cdot EH; \quad V2=E2 \cdot EH.$$

Formula (5) is rewritten by use of a coefficient K1 depending on resistance of the resistors 61–63 and irrespective of the power supply voltage EH:

$$Rs=K1Ts \quad (6),$$

where $K1=1/[C \cdot ln(E1/E2)]$.

Similarly, resistance Rxi (I=1,2, . . . , n) of the heating elements $20_1$–$20_n$ is expressed as:

$$Rxi=K1 \cdot Txi \quad (7),$$

where $K1=1/[C \cdot ln(E1/E2)]$.

Formulae (6) and (7) result in the following formula, from which the resistance Rxi is obtained in accordance with the resistance Rs:

$$Rxi=Txi/Ts \cdot Rs \quad (8).$$

The resistance Rxi of the heating elements $20_1$–$20_n$ does not depend on the power supply voltage EH at the measuring time. It is possible to precisely determine the resistance Rxi, even if the power supply voltage EH changes with time or changes each time of measuring one of the heating elements.

The heat energy errors depends on irregularity in the resistance Rxi of the heating elements $20_1$–$20_n$, but can be compensated for without use of the resistance Rxi. In the color thermal printer, the ratio between the discharging time Ts via the reference resistor 52 and the discharging time Txi via the heating elements $20_1$–$20_n$ can be determined without determining the resistance Rxi, on the basis of Formula (8). The resistance Rxi is proportional to Txi/Tx, so that Txi/Tx is used as data Di. This is an advantage, since it allows resistance Rxi to be determined indirectly, eliminating the time and effort otherwise spent directly determining the resistance Rxi.

Now operation of the printing is described. At first, image data of yellow, magenta and cyan of an image to be printed is written to the image memory group 31. A manual operating panel (not shown) connected to the system controller 30 is operated to command printing. The selector switch 38 is switched to the side of the thermal head. The heating elements $20_1$–$20_n$ written to EEPROM 33a, the resistance change compensator 33 compensates the fundamental bias data, which may be "240", for yellow, to produce compensated bias data of the heating elements $20_1$–$20_n$. Let Dm be average of the resistance data Di. It is preferable, for example, to obtain differences between the average resistance data Dm and the resistance data Di, and to compensate the fundamental bias data according to the data differences, for producing the compensated bias data.

If the resistance data Di is smaller than the average resistance data Dm, an amount of generated heat would be greater. Then the compensated bias data is set "230". Furthermore, the average resistance data Dm is multiplied by resistance of the reference resistor 52 to obtain average resistance, to regulate a head voltage from the power source circuit 40. Note that it is possible to use maximum resistance data instead of the average resistance data Dm, and effect subtraction between "240" and a value proportional to a difference between the resistance data Di and the maximum resistance data.

Also for magenta and cyan, the resistance change compensator 33 compensates the fundamental bias data according to the resistance data Di (i=1, 2, . . . , n) of the heating elements $20_1$–$20_n$, to produce compensated bias data of the heating elements $20_1$–$20_n$, is compensated.

After the compensated bias data corresponds to the three colors is written to RAM 33b, the printing controller 36 starts feeding the recording sheet 13, of which the front edge is retained on the periphery of the platen drum 10 by the clamper 14. The platen drum 10 is rotated to wind the recording sheet 13 about the platen drum 10.

The platen drum 10 makes an intermittent rotation step-by-step, as predetermined, until the front edge of a recording region of the recording sheet comes to the thermal head 16. The thermal head 16 is swung down to press the heating element array 20 against the recording sheet 13. Then an image starts being printed. At first, the three-color image data of the first line is read from the image memory group 31, and sent to the color corrector 32 by taking the three-color image data into consideration, and written to RAM 33b of the resistance change compensator 33.

When the yellow image data of the first line is written to RAM 33b, the resistance change compensator 33 adjusts the compensated bias data for yellow by use of the yellow image data and the resistance data for yellow by use of the yellow image data and the resistance data Di, to remove an energy error in the image heating. Accordingly, the bias data of the first line of the yellow image is created. The image heat energy error is greater in proportion to greatness of the image data, which heightens the number of times of driving the heating elements in the image heating. The bias heat energy, in accordance with the bias data being created, is compensated by the resistance data Di and the yellow image data. The bias heat energy is not necessarily equal to the bias heat energy Eby predetermined for the yellow.

The bias data for one line is sent to the line memory 34 successively, pixel-after-pixel, and written to it. After writing the one-line bias data for all its pixels, the one-lines bias data is read from the line memory 34 successively, pixel-after-pixel, and sent to the comparator 35. The printing controller 36 causes a counter of the comparator 35 to generate the comparison data of 1 (one).

The comparator 35 compares the bias data being input respectively with the comparison data of 1 (one). If the bias data is equal to or greater than the comparison data of 1 (one), the comparator 35 generates the bias drive data of 1 (one). If not, the comparator 35 generates the bias drive data of 0 (zero). The bias drive data of one line as obtained is output serially and sent to the thermal head 16. The serial drive data is converted by the shift register 41 into a parallel form of the bias drive data.

The bias drive data of the parallel form is latched in the latch array 42, which in turn sends the bias drive data of the parallel form to the gate array 43. After the latching at the latch array 42, the printing controller 36 sends the gate array 43 the bias strobe signal for yellow. The gate array 43 determines a logical product of the drive data of one line and the bias strobe signal from the selector switch 38.

When the bias drive data is 1 (one), a bias drive pulse as wide as the bias strobe signal is sent to an associated one of the transistors in the heat control switch array 44 through an output of the gate array 43 associated with the bias drive data. The bias data is not compensated to the value 0 (zero), so that any of the heat control transistors $44_1$–$44_n$ receives the first one of the bias drive pulses. The heat control transistors $44_1$–$44_n$ switch on the heating elements $20_1$–$20_n$ of the heating element array 20 while the bias drive pulses are input to them. The heating elements $20_1$–$20_n$ are driven simultaneously and heated.

During the application of heat caused by the first one of the bias drive pulses, the printing controller 36 incrementally steps the counter of the comparator 35, which is caused to generate the comparison data of 2 (two). Reading from the line memory 34 is effected for the second time. The one-line bias data is read from the line memory 34 successively pixel-after-pixel, and sent to the comparator 35. In the procedure as described above, a second set of bias drive pulses is produced for the one line after heating caused by the first set of the bias drive pulses, to drive the heating elements $20_1$–$20_n$ at the same time.

Similarly, bias drive impulses are created by use of the comparison data of 2–255, to drive the heating elements $20_1$–$20_n$. Each of the heating elements $20_1$–$20_n$ is driven at times corresponding to the yellow bias data, at most at 255 times. If the yellow bias data is 248, then a corresponding one of the heating elements is driven at 248 times during the bias heating. The heat energy is applied to a position of one first line of the recording sheet 13 at an amount of addition/subtraction of the bias heat energy error and the image heat energy error to/from the bias heat energy Eby.

After the bias heating, a first line of the yellow image data is read from RAM 33b of the resistance change compensator 33, and written to the line memory 34. Then the first line of the yellow image data is read from the line memory 34 pixel-after-pixel, and sent to the comparator 35. In a manner similar to the bias drive data, the comparator 35 compares the yellow image data being input respectively with the comparison data of 1 (one). If the yellow image data is equal to or greater than the comparison data of 1 (one), the comparator 35 generates the image drive data of 0 (zero). The image drive data of one line as obtained is output serially and sent to the thermal head 16.

The image drive data of one line is converted to image drive pulses at the thermal head 16 by use of the image strobe signal from the printing controller 36. If the image drive data is 0 (zero), then no image drive pulse is generated. The heating elements $20_1$–$20_n$ of the heating element array 20 are selectively caused to heat by the image drive pulses of the one line by means of the heat control transistors $44_1$–$44_n$.

Similarly, image drive pulses are created by use of the comparison data of 2–555, to drive the heating elements $20_1$–$20_n$ selectively. Each of the heating elements $20_1$–$20_n$ is driven at times corresponding to the yellow image data, to generate heat. If the yellow printing is desired at the highest density in a pixel, then a corresponding one of the heating elements $20_1$–$20_n$ is driven at 255 times during the image heating. If the yellow printing is desired at the highest density in a pixel, then a corresponding one of the heating elements $20_1$–$20_n$ is driven at 255 times during the image heating. If the yellow printing is desired at the lowest density in a pixel, then a corresponding one of the heating elements $20_1$–$20_n$ is not driven.

This being so, the recording sheet 13 is subjected to the bias heating and the image heating, and provided with the coloring heat energy corresponding to the yellow image data. According to the characteristic curve in FIG. 4, the yellow coloring layer 26 is colored at the density according to the image data, to print a dot within a pixel being rectangular. If the equal yellow image data is printed with two heating elements being different in resistance, the equal heat energy can be generated from the two heating elements, to color the yellow coloring layer 26 at the equal density.

When the first line of the yellow image is recorded, the platen drum 10 is rotated step wise by one line. The three-color image data for a second line is read from the image memory group 31. The yellow image data is written to RAM 33b of the resistance change compensator 33. In a manner similar to the first line, the resistance change compensator 33 compensates the compensated bias data for yellow written in RAM 33*b*, in accordance with the yellow image data of the second line and the resistance data Di. The bias data is obtained, and is used in the bias heating of a position on the recording sheet 13 of the second line. After the bias heating, the yellow image data of the second line from Ram 33*b* is written to the line memory 34. The yellow image data of the second line from RAM 33*b* is read from the line memory 34, and used in effecting the image heating of the second line. The second line is recorded on the recording sheet 13.

Similarly third, fourth and fifth lines and so on of the yellow image are recorded successively. After recording the yellow image, ultraviolet rays of 420 nm are applied to the recording sheet 13 by the yellow fixer 17. The yellow coloring layer 26 is optically fixed.

The platen drum 10 makes one rotation, again to move the recording region to the thermal head 16. A magenta image is recorded to the cyan coloring layer 24 line-by-line. Each pixel is recorded by combination of the bias heating and the image heating. In the bias heating, magenta bias data is used after compensation by means of the magenta image data and the resistance data Di. After recording the magenta image, ultraviolet rays of 365 nm are applied to the recording sheet 13 by the magenta fixer 18. The magenta coloring layer 25 is optically fixed.

The platen drum 10 makes another rotation to place the recording region to the bottom of the thermal head 16. A cyan image is recorded to the cyan coloring layer 24 line-by-line. In the bias heating, cyan bias data is used after compensation by means of the cyan image data and the resistance data Di. There is no operation of optical fixation of the cyan coloring layer 24. After finishing the cyan recording, the recording sheet 13 is exited to a tray of the printer.

A full color image is recorded on the recording sheet 13 in 256 steps of the gradation for each of the three colors. No irregularity in the density occurs in the full color image, even with the irregularity existing in the resistance of the heating elements $20_1$–$20_n$.

The resistance data Di is determined after finishing measurement of the discharging time of all the heating elements. Also, it is possible to determine the resistance data Di each time by measuring the discharging time of one of the heating elements. Instead of the resistance data Di, resistance as obtained may be used, and compared with an idealized resistance of an originally designed resistor to calculate a resistance difference. The driving condition of the heating elements may be compensated according to the resistance difference. In the above embodiment, the reference resistor 52 is externally attached to the thermal head 16. Alternatively, one of the heating elements can be used as a reference resistor.

Another preferred embodiment is hereinafter described, in which the resistance data Di is obtained from charging time and discharging time. Elements similar to those of the above embodiment are designated with identical reference numerals.

Figure 10:
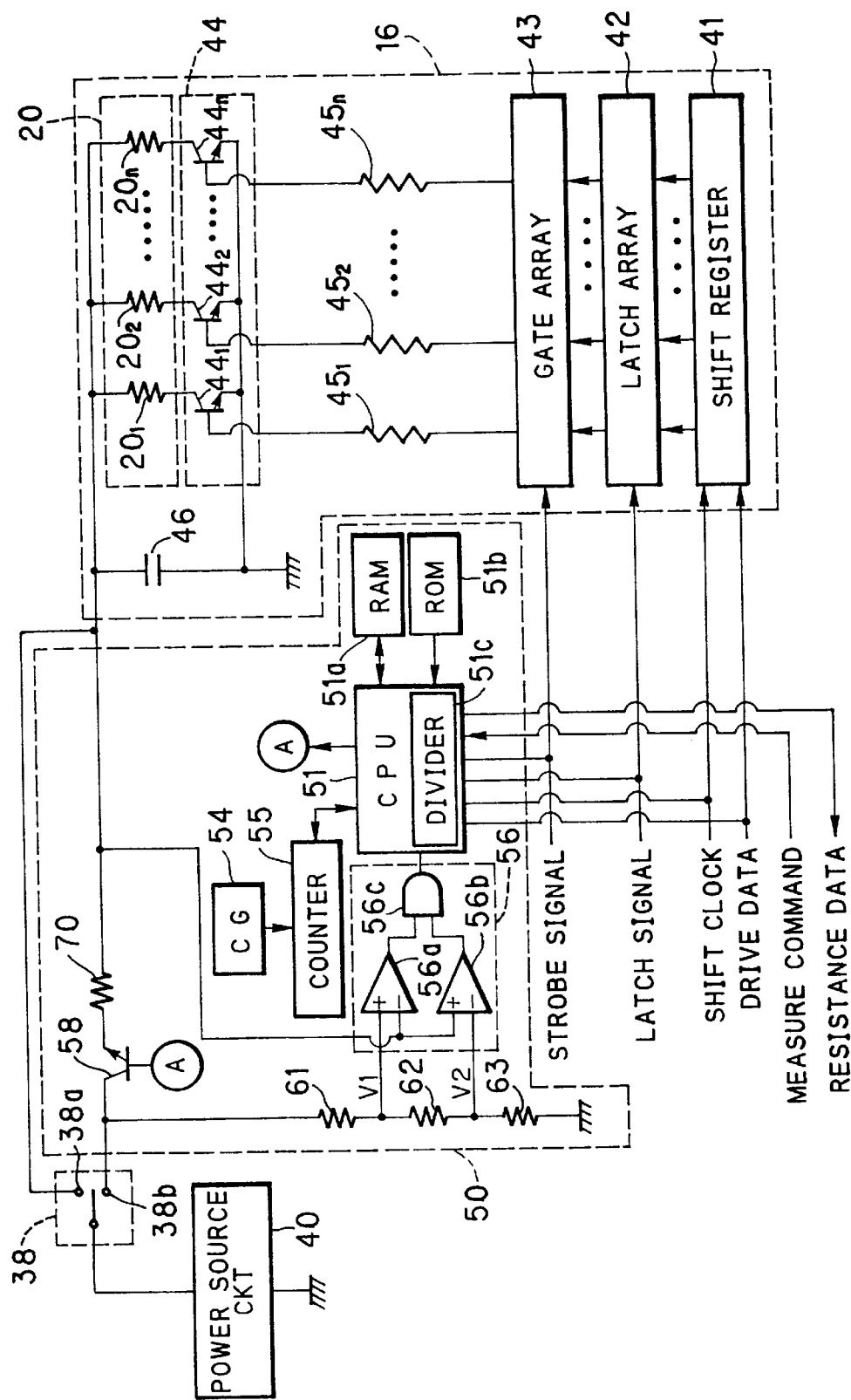
FIG. 10 is a block diagram schematically illustrating another preferred resistance data measuring device in which charging time and discharging time are measured.

The resistance data measuring device 50 in FIG. 10 is similar to that of FIG. 2, but has a reference resistor 70 instead of the resistor 64 and does not include the additional transistor 53 and the reference resistor 52. A resistance Rq of the reference resistor 70 a high precision resistor with high quality similar to the reference resistor of the above embodiment, resistor 70 producing small errors such as 1%. The determination of the resistance data Di does not depend on the resistance Rq of the reference resistor 70, which can be set as desired for design.

The resistors 61–63 have such resistance that the predetermined voltages V1 and V2 are determined as:

$$V1 = \tfrac{3}{4} \cdot EH; \quad V2 = \tfrac{1}{4} \cdot EH,$$

for the purpose of simplifying an equation for obtaining the resistance data Di.

CPU 51 measures a charging time and a discharging time of the capacitor 46 using counter 55. When the charging time is measured, CPU 51 turns on the charging transistor 58, charges the capacitor 46 via the reference resistor 70, and causes the counter 55 to count the number of generated clock pulses in accordance with signal CHG while the capacitor voltage Vc charges from the predetermined low voltage V2 to the predetermined high voltage V1. The count Ck of the counter 55 is written to RAM 51*a* as a charging time Tq.

CPU 51 measures the discharging time T×i (i=1, 2, . . . ,n) of the change of the capacitor voltage Vc from the predetermined high voltage V1 down to the predetermined low voltage V2 during the discharge of the capacitor 46 via each of the heating elements $20_1$–$20_n$. Each time after the measurement of the charging time Tq and the discharging time T×i (I=1,2, . . . , n) for one of the heating elements $20_1$–$20_n$, the divider 51*c* calculates the resistance data Di (i=1, 2, . . . , n) for each of the heating elements $20_1$–$20_n$ according to the formula:

$$Di = T \times i / Tq.$$

Note that it is also possible to store the charging time Tq and discharging time T×i obtained from the heating elements $20_1$–$20_n$ in RAM 51*a*, and to obtain the resistance data Di after the discharging time T×i of all the heating elements $20_1$–$20_n$.

Figure 11:
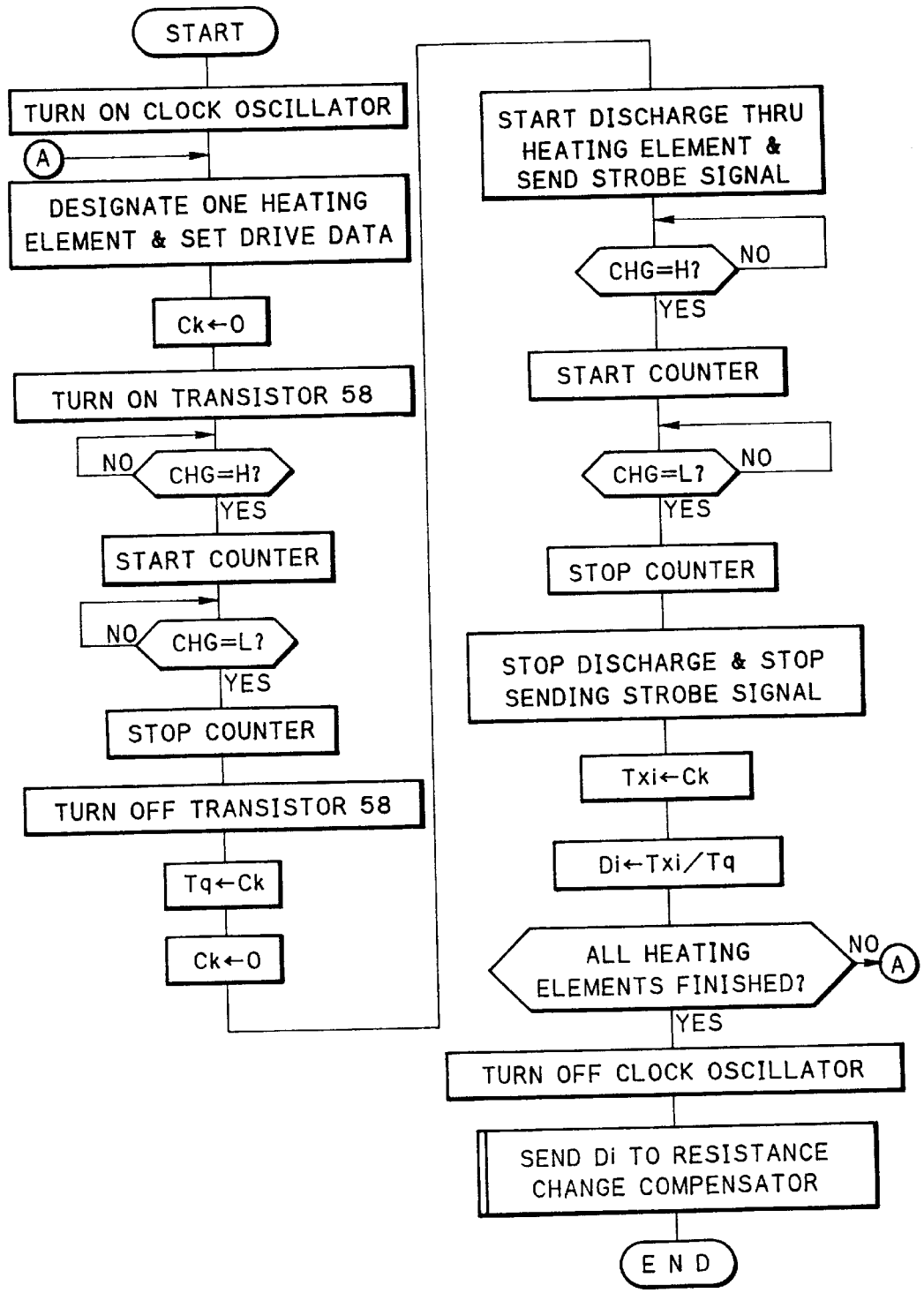
FIG. 11 is a flow chart illustrating determination of resistance data according to the resistance data measuring device of FIG. 10.

In the resistance data measuring device 50 of FIG. 10, CPU 51 determines the resistance data Di of the heating elements $20_1$–$20_n$ by following the routine of FIG. 11. CPU 51 starts the measurement for the first time to measure the heating element $20_1$. CPU 51 resets the counter 55 for the count Ck to have 0 (zero), and turns on the charging transistor 58. The thermal head 16 is supplied with power by the power source circuit 40 via the reference resistor 70, to charge the capacitor 46.

As shown in FIG. 12, the capacitor voltage Vc across the capacitor 46 increases at a ratio of change according to the resistance Rq of the reference resistor 70. When the signal CHG comes over the predetermined low voltage V2 and becomes "High", the counter 55 begins counting to measure the charging time. When the capacitor voltage Vc exceeds the predetermined high voltage V1 slightly during the charging and the signal CHG becomes "Low", CPU 51 stops the measurement of the charging time.

The charging time depends on the capacitor 46, the resistance Rq of the reference resistor 70, the power supply voltage EH and the predetermined high voltage V1, and is 10 msec according to the present embodiment. After the stop of the charging, CPU 51 reads the count Ck from the counter 55, and sets the count Ck as the charging time Tq, and writes it to RAM 51*a*.

CPU 51 resets the count Ck as 0 (zero), and turns on only the heat control transistor $44_1$, to begin discharging the capacitor 46 via the heating element 201. When the signal CHG is slightly below the predetermined high voltage V1 and becomes "high", CPU 51 starts the counter 55 to start measurement of the discharging time. During the discharge, the signal CHG decreases to a level slightly below the predetermined low voltage V2 and becomes "Low". CPU 51 stops the counter 55 to stop the measurement of the discharging time.

CPU 51 stops the discharge, reads the count Ck from the counter 55, sets the count Ck as the discharging time T×1, and writes discharging time T×1 to RAM 51a. Then CPU 51 reads the charging time Tq and discharging time T×1 from RAM 51a, and calculates resistance data D1 (=T×1/Tq) associated with the heating element $20_1$.

The resistance data D1 itself is not the resistance of the heating element $20_1$, but corresponds closely to the resistance of the heating element $20_1$. The resistance data $D_1$ is written to RAM 51a.

CPU 51 effects measurement for the second time for the purpose of obtaining resistance data D2 associated with the heating element $20_2$. In a manner similar to the first time, the charging time Tq of the capacitor 46 is measured via the reference resistor 70 I accordance with the changes in the signal CHG. The discharging time T×2 related to the heating element $20_2$ is measured. The resistance data D2 (=T×2/Tq) is calculated from the charging time Tq and discharging time T×2 as obtained, and is written to RAM 51a. Similarly CPU 51 effects measurement for the third, fourth, . . . ,nth times, and obtains resistance data D3, D4, . . . , Dn associated with the heating elements $20_3$–$20_n$.

The determination of the resistance data Di is described now in detail. The capacitor 46 is charged up to the power supply voltage EH via the reference resistor 70. Assuming the capacitor 46 has capacitance C, a relationship between the capacitor voltage Vc across the capacitor 46 and a charging time t is expressed as:

$$Vc=EH \cdot \{1-exp(-t/Rq \cdot C)\} \quad (11).$$

Assuming t3 represents the time taken for the capacitor voltage Vc to reach the predetermined high voltage V1 in the charge of the capacitor 46 via the reference resistor 70, and assuming t4 represents the time taken for the capacitor voltage Vc to reach the predetermined low voltage V2 in the charge of the capacitor 46 via the reference resistor 70 (t4<t3), the predetermined voltages V1 and V2 are expressed as follows:

$$V1=EH \cdot \{1-exp(-t3/Rq \cdot C)\} \quad (12),$$

and $$V2=EH \cdot \{1-exp(-t4/Rq \cdot C)\} \quad (13).$$

The charging time Tq is equal to a difference (t3–t4) of time, and thus is expressed as Formula (14). The resistance Rq is expressed as Formula (15).

$$Tq=t3-t4=C \cdot Rq \ ln\{(Eh-V2)/(EH-V1)\} (14).$$

$$Rq=Tq/ [C \cdot ln\{(EH-V2)/(EH-V1)\}] \quad (15).$$

The resistance R×i is defined in a manner similar to Formula (7) in modification according to the capacitance C and the predetermined voltages V1 and V2, and is expressed by Formula (16):

$$R \times i=Ti/\{C \cdot ln(V1/V2)\} \quad (16).$$

According to Formulae (15) and (16), a relationship between the resistance Rq of the reference resistor 70 and the resistance R×i is expressed as:

$$R \times i=T \times i/Tq \cdot Rq/K2 \quad (17),$$

where, $K2=\{ln \ (V1/V2)\}/[ln \ \{(EH-V2)/(EH-V1)\}]$

In relation to Formula (17), a coefficient K2 depends on resistance of the resistors 61–63 and irrespective of the power supply voltage EH. The coefficients E1 and E2 are used again to define V1 and V2.

$$V1=E1 \cdot EH; \ V2=E2 \cdot EH.$$

Therefore, $$K2=\{ln(E1/E2)\}/[ln\{ln\{1-E2)/(1-E1)\}]\}.$$

The resistance R×i of the heating elements $20_1$–$20_n$ does not depend on the power supply voltage EH at the measuring time. It is therefore possible precisely to determine the resistance R×i.

If E1 and E2 satisfy the relationship:

$$E1^2-E2^2-E1+E2=0$$

namely E1/E2=(1–E2)/(1–E1) where E1>E2, then the coefficient K2 is 1 (one), to simplify arithmetic operation of obtaining the resistance R×i. In the present embodiment, the resistance of the resistors 61–63 is determined to satisfy:

$$E1=¾; \ E2=¼,$$

So that K2=1. The resistance R×i of the heating elements $20_1$–$20_n$ is obtained from the following formula:

$$R \times i=T \times i/Tq \cdot Rq \quad (18).$$

It is unnecessary to calculate the resistance R×i of the heating elements $20_1$–$20_n$. The resistance R×i is proportional to T×i/Tq of which the discharging time T×i is obtained from the heating elements $20_1$–$20_n$, and the charging time Tq is obtained from the reference resistor 70. Hence the T×i/Tq is used as the resistance data Di.

It is therefore, possible to shorten the durations required for measurement of the heating elements $20_1$–$20_n$. Only 10 seconds is spent in measuring the 512 heating elements. There is only a slight interval between the discharging time and the charging time being measured, so that the precision in the measurement can be increased.

In the above embodiments, the number of the bias drive pulses are changed to compensate for the heat energy errors including the bias heat energy error and the image heat energy error. It is also possible to change the width of the bias drive pulses to compensate for the heat energy errors. Furthermore, the number of width of the bias drive pulses can be changed for compensating for the bias heat energy error. The number or width of the image drive pulses can be changed for compensating for the image heat energy error.

The present invention could be applied to a separate type of resistance data measuring device which would be a part of the above-described thermal printer, and which would be detached from it. This resistance data measuring device may be used as a tool or instrument for inspecting the thermal head.

In the above embodiments, the resistance data is measured in the factory for adjustment after manufacture and assembly. The present invention is also applicable to an automatic measuring operation of the resistance data. The automatic operation can be triggered in the printer upon powering the printer by a user's manual operation, or upon lapse of a period predetermined suitably.

In the above embodiments, the capacitor is charged up to the predetermined high voltage V1 at the highest. It is also possible to charge the capacitor to a voltage slightly higher than the predetermined high voltage V1.

The above embodiments are applied to a color thermal printer of a direct recording type. The present invention is also applicable to monochromatic thermal printer, or a thermal printer of a thermal transfer type. The above embodiments are directed to a line printer in which the thermal head is moved one-dimensionally relative to the recording sheet. The present invention is applicable to a serial printer in which the thermal head is moved two-dimensionally relative to the recording sheet. The present invention is also applicable to a three-head/one-pass type of color thermal printer including three thermal heads for the yellow, magenta and cyan.

In the above embodiments, the resistance data of all the heating elements are determined. The present invention is applicable to determining resistance data of only at least one of the heating elements. For this operation, the discharging time measured via the reference resistor 52 and discharging time measured via the at least one heating element are considered, or the charging time measured via the reference resistor 70 and discharging time measured via the at least one heating element are considered.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A resistance data measuring method for a thermal head having plural heating elements arranged along a line and connected in parallel with one another, said heating elements each being connected to one of plural heat control switches, said heat control switches being selectively turned on/off for driving said heating elements individually by applying electrical energy to generate heat, said resistance data measuring method comprising:

charging a capacitor connected in parallel with said plural heating elements to a predetermined high voltage;

after charging said capacitor, discharging said capacitor via one of a reference resistor and one of said heating elements, said reference resistor being connected in parallel with said plural heating elements and said capacitor;

measuring an amount of time that elapses while a capacitor voltage measured across said capacitor decreases from said predetermined high voltage that is lower than a source voltage to a predetermined low voltage, said amount of time being based on a resistance of said one of said reference resistor and said one heating element; and determining resistance data for said one heating element based on said amount of time measured.

2. A resistance data measuring method as defined in claim 1, wherein said resistance data is a ratio of discharging time of each of said heating elements to discharging time of said reference resistor, and represents a relative greatness of resistance.

3. A resistance data measuring method as defined in claim 2, wherein said voltage detecting step includes comparing said capacitor voltage with a first reference voltage set equal to said predetermined high voltage, and with a second reference voltage set equal to said predetermined low voltage, to generate a detection signal when said capacitor voltage is between said first and second reference voltages, further comprising steps of:

starting measurement of time based on the occurrence of said detection signal; and finishing said measurement of time based on a termination of said detection signal.

4. A resistance data measuring method, comprising:

charging a capacitor to a first predetermined voltage;

discharging charge stored in the capacitor using a heating element positioned in parallel with the capacitor;

measuring a first amount of time that elapses when a voltage of the capacitor is decreased from the first predetermined voltage to a second predetermined voltage based on the heating element, where the first predetermined voltage is lower than a supply voltage and the second predetermined voltage is lower than the first predetermined voltage; and calculating resistance data related to the heating element based on the first amount of time measured.

5. The resistance data measuring method recited by claim 4, further comprising:

discharging the charge stored in the capacitor using a resistor positioned in parallel with the capacitor; and measuring a second amount of time that elapses when charge stored in the capacitor is decreased from the first predetermined voltage to the second predetermined voltage based on the resistor, where the calculating step comprises calculating the resistance data based on the first amount of time measured and the second amount of time measured, and where the capacitor is recharged between the discharge using the resistor and the discharge using the heating element.

6. The resistance data measuring method recited by claim 5, wherein charge stored in the capacitor is discharged based on the resistor before the heating element.

7. The resistance data measuring method recited by claim 5, wherein the resistance data represents a ratio of the discharging time of the heating element to the discharging time of the resistor.

8. The resistance data measuring method recited by claim 4, further comprising:

comparing the voltage of the capacitor with the first predetermined voltage; and stopping the application of charge to the capacitor when the voltage of the capacitor reaches the first predetermined voltage.

9. The resistance data measuring method recited by claim 4, further comprising:

comparing the voltage of the capacitor with the first predetermined voltage and the second predetermined voltage;

initiating measurement of an appropriate one of the first and second amount of time when the voltage of the capacitor falls below the first predetermined voltage;

stopping measurement of the appropriate one of the first and second amount of time when the voltage of the capacitor falls below the second predetermined voltage.

10. A resistance data measuring method, comprising:

charging a capacitor to a first predetermined voltage;

discharging charge stored in the capacitor using a selected one of plural heating elements positioned in parallel with the capacitor;

measuring a first amount of time that elapses when a voltage of the capacitor is decreased from the first predetermined voltage to a second predetermined voltage based on the selected heating element, where the first predetermined voltage is lower than a supply voltage and the second predetermined voltage is lower than the first predetermined voltage; and calculating resistance data related to the selected heating element based on the first amount of time measured.

11. The resistance data measuring method recited by claim 10, further comprising:

discharging charge stored in the capacitor using each of plural heating elements positioned in parallel with the capacitor;

measuring a first amount of time that elapses when a voltage of the capacitor is decreased from a first predetermined voltage to a second predetermined voltage based on the each heating element, respectively, where the first predetermined voltage is lower than a supply voltage and the second predetermined voltage is lower than the first predetermined voltage; and calculating resistance data related to each heating element based on the corresponding first amount of time measured, where the charging step includes recharging the capacitor between each discharge.

12. The resistance data measuring method recited by claim 11, further comprising:

discharging the charge stored in the capacitor using a resistor positioned in parallel with the capacitor; and measuring a second amount of time that elapses when charge stored in the capacitor is decreased from the first predetermined voltage to the second predetermined voltage based on the resistor, where the calculating step comprises calculating the resistance data based on each first amount of time measured and the second amount of time measured, and where the capacitor is recharged between the discharge using the resistor and the discharge using the heating elements.

13. The resistance data measuring method recited by claim 12, wherein charge stored in the capacitor is discharged based on the resistor before the heating elements.

14. The resistance data measuring method recited by claim 12, wherein the resistance data represents ratios of the discharging time of each heating element to the discharging time of the resistor.

15. The resistance data measuring method recited by claim 11, further comprising:

comparing the voltage of the capacitor with the first predetermined voltage; and stopping the application of charge to the capacitor when the voltage of the capacitor reaches the first predetermined voltage.

16. The resistance data measuring method recited by claim 11, further comprising:

comparing the voltage of the capacitor with the first predetermined voltage and the second predetermined voltage;

initiating measurement of an appropriate one of the first and second amount of time when the voltage of the capacitor falls below the first predetermined voltage;

stopping measurement of the appropriate one of the first and second amount of time when the voltage of the capacitor falls below the second predetermined voltage.

* * * * *